United States Patent
Satoh

(10) Patent No.: US 10,342,114 B2
(45) Date of Patent: Jul. 2, 2019

(54) RF RESONATOR FOR ION BEAM ACCELERATION

(71) Applicant: Axcelis Technologies, Inc., Beverly, MA (US)

(72) Inventor: Shu Satoh, Byfield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 16/124,676

(22) Filed: Sep. 7, 2018

(65) Prior Publication Data

US 2019/0088443 A1 Mar. 21, 2019

Related U.S. Application Data

(60) Provisional application No. 62/559,103, filed on Sep. 15, 2017.

(51) Int. Cl.
*H05H 5/08* (2006.01)
*H05H 7/18* (2006.01)
*C23C 14/48* (2006.01)
*H01J 37/24* (2006.01)
*H01J 37/317* (2006.01)

(52) U.S. Cl.
CPC ............ *H05H 7/18* (2013.01); *C23C 14/48* (2013.01); *H01J 37/24* (2013.01); *H05H 5/08* (2013.01); *H01J 37/3171* (2013.01)

(58) Field of Classification Search
CPC ........ H01J 37/24; H01J 37/3171; H05H 7/18; H05H 5/08; C23C 14/48
See application file for complete search history.

(56) References Cited

U.S. PATENT DOCUMENTS

| 4,667,111 | A | 5/1987 | Glavish et al. |
| 5,504,341 | A | 4/1996 | Glavish |
| 6,254,746 | B1 | 7/2001 | Subramani et al. |
| 6,262,638 | B1 * | 7/2001 | Scherer ............... H05H 5/08 333/174 |
| 2004/0104682 | A1 * | 6/2004 | Horsky ............... H01J 27/205 315/111.81 |
| 2014/0145581 | A1 * | 5/2014 | Jerez ............... H01J 37/3171 313/36 |

OTHER PUBLICATIONS

International Search Report and Written Opinion dated Jan. 21, 2019 in connection with International Application No. PCT/US2018/050587.

\* cited by examiner

*Primary Examiner* — Dedei K Hammond
*Assistant Examiner* — Raymond R Chai
(74) *Attorney, Agent, or Firm* — Eschweiler & Potashnik, LLC

(57) ABSTRACT

An RF feedthrough has an electrically insulative cone that is hollow having first and second openings at first and second ends having first and second diameters. The first diameter is larger than the second diameter, defining a tapered sidewall of the cone to an inflection point. A stem is coupled to the second end of the cone, and passes through the first opening and second opening. A flange is coupled to the first end of the cone and has a flange opening having a third diameter. The third diameter is smaller than the first diameter. The stem passes through the flange opening without contacting the flange. The flange couples the cone to a chamber wall hole. Contact portions of the cone may be metallized. The cone and flange pass the stem through the hole while electrically insulating the stem from the wall of the chamber.

20 Claims, 5 Drawing Sheets

RF RESONATOR FOR ION BEAM ACCELERATION

REFERENCE TO RELATED APPLICATIONS

This application claims the benefit of U.S. Provisional Application No. 62/559,103 filed Sep. 15, 2017, entitled "RF RESONATOR FOR ION BEAM ACCLELERATION", the contents of which are herein incorporated by reference in their entirety.

FIELD

The present disclosure relates generally to ion implantation systems, and more specifically to an improved RF high voltage generator or RF resonator apparatus and RF feedthrough, wherein a lifetime of the RF resonator apparatus and associated components is increased and a leakage of gas from the RF resonator and a high-vacuum environment of the ion implantation system is generally prevented.

BACKGROUND

A cyclic electric field has long been used for ion beam acceleration since the invention of linear RF accelerators and the cyclotron. In order to accelerate ions to an energy of several MeV, RF accelerators have been developed to repeatedly accelerate the ion beam, at a relatively low energy gain of approximately 100 KeV at each stage, in order to avoid difficulties in producing a mega-volt DC voltage. However, the RF accelerators still require generation of an RF voltage of approximately 100 KV peak voltage, which is achieved by the use of a high-Q resonance circuit for conversion of RF power (typically at low impedance of 50 ohms) into the high RF voltage.

At a low RF frequency (e.g., less than approximately 30 MHz), the resonant circuit is typically a lumped circuit comprising a coil and a capacitor (e.g., via distributed capacitance), rather than cavity resonators that are used at higher frequencies. For the application of RF accelerators used in ion implantation, the majority of ion species of interest are so-called heavy ions (e.g., Boron, Phosphorus and Arsenic), and because of their heavy masses, the velocity tends to be slow. On the cyclic acceleration induced by RF, the slow velocity translates into the use of low frequency RF voltage (e.g., less than 30 MHz), which is generated by a lumped resonance circuit (e.g., a resonator).

SUMMARY

The present disclosure overcomes limitations of the prior art by providing a system, apparatus, and method for an improved vacuum feedthrough for a radio frequency (RF) resonator that can be associated with vacuum system such as an ion implantation system, thereby improving performance and extending the lifetime of the vacuum system. Accordingly, the following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

In accordance with one exemplary aspect, an RF feedthrough for an ion implantation system is provided. The RF feedthrough, for example, comprises an electrically insulative cone having a first cone end and a second cone end. The electrically insulative cone is generally hollow and has a first opening at the first cone end and a second opening at the second cone end. The first opening has a first diameter associated therewith and the second opening has a second diameter associated therewith, and wherein in one example, the first diameter is larger than the second diameter. In one example, a tapered sidewall of the electrically insulative cone is generally defined between the first diameter and the second diameter.

A stem is further operably coupled to the second cone end of the electrically insulative cone, wherein the stem passes through the first opening and second opening of the electrically insulative cone. A flange, for example, is operably coupled to the first cone end of the electrically insulative cone. The flange has a flange opening defined therein, wherein the flange opening has a third diameter associated therewith. In one example, the third diameter is smaller than the first diameter.

The stem, for example, passes through the flange opening without contacting the flange, and wherein the flange is configured to operably couple the electrically insulative cone to a hole defined in a wall of a chamber. The electrically insulative cone and flange, for example, are configured to pass the stem through the hole in the wall of the chamber while electrically insulating the stem from the wall of the chamber.

According to one example, the electrically insulative cone comprises a cylindrical region extending a predetermined distance from the first end of the cone toward the second end of the electrically insulative cone to an inflection point. The cylindrical region, for example, has a fixed diameter, where an internal diameter of the electrically insulative cone tapers from the inflection point toward the second end of the electrically insulative cone, therein defining the tapered sidewall of the electrically insulative cone.

In one example, the electrically insulative cone comprises an interface surface between the first end of the electrically insulative cone and the flange, wherein the interface surface is generally perpendicular to an inner surface of the electrically insulative cone in the cylindrical region. In another example, the flange comprises a lip extending from a region associated with the first end of the electrically insulative cone toward the second end of the electrically insulative cone, wherein the lip has curved region configured to ameliorate arcing between the flange and the electrically insulative cone.

According to another exemplary aspect, a padding cap is operably coupled to the stem in a region proximate to the flange. The padding cap, for example, extends outwardly a predetermined distance from an outer diameter of the stem, therein generally preventing a line-of-sight from a region within the chamber to an inner surface of the cone. The padding cap, for example, has a fourth diameter associated therewith, wherein the fourth diameter is greater than the third diameter.

In accordance with another exemplary aspect, the stem comprises a first stem end and a second stem end. The first stem end, for example, comprises an accelerating electrode operably coupled thereto, and the second stem end is configured to be coupled to a resonator coil.

According to another exemplary aspect, respective interfaces between the electrically insulative cone, stem, flange, and wall of the chamber seal a chamber environment within the chamber from an environment associated with the resonator coil. Further, one or more o-rings generally seal an interface between the flange and the electrically insulative cone. In another example, another one or more o-rings seal an interface between the stem and the electrically insulative cone.

In accordance with yet another exemplary aspect, a first surface of the first end of the electrically insulative cone and a second surface of the second end of the electrically insulative cone are metallized. One or more metal shorting strips, for example, may be disposed between the first surface of the first end of the electrically insulative cone and the flange. In another example, one or more metal shorting strips may be disposed between the second surface of the electrically insulative cone and the stem. The one or more metal shorting strips, for example, may comprise one or more metal springs.

According to another example of the disclosure, a body of the electrically insulative cone is comprised of a ceramic. In another example, the body of the electrically insulative cone comprises one or more of alumina and quartz. In yet another example, the body of the electrically insulative cone is comprised of quartz.

According to another exemplary aspect, an RF resonator for an ion implantation system is provided. The RF resonator, for example, comprises a resonator chamber defining a chamber environment. The chamber environment, for example, is generally isolated from a vacuum environment by a wall of the chamber. A resonator coil, for example, is disposed within the resonator chamber.

Further, the RF resonator comprises an RF feedthrough, comprising an electrically insulative cone having a first cone end and a second cone end. The electrically insulative cone is generally hollow and has a first opening at the first cone end and a second opening at the second cone end, wherein the first opening has a first diameter associated therewith and the second opening has a second diameter associated therewith. The first diameter, for example, is larger than the second diameter, therein generally defining a tapered sidewall of the electrically insulative cone. A stem is further operably coupled to the second cone end of the electrically insulative cone, wherein the stem passes through the first opening and second opening of the electrically insulative cone.

Further, a padding cap is operably coupled to the stem in a region proximate to the flange. The padding cap, for example, extends outwardly a predetermined distance from an outer diameter of the stem to a fourth diameter, wherein the fourth diameter is greater than the third diameter. Accordingly, a line-of-sight is generally prevented from a region within the chamber to an inner surface of the cone by the flange, padding cap, and stem.

According to another example, a flange is operably coupled to the first cone end of the electrically insulative cone, wherein the flange has a flange opening defined therein. The flange opening has a third diameter associated therewith, wherein the third diameter is smaller than the first diameter. The stem, for example, passes through the flange opening without contacting the flange, and wherein the flange is configured to operably couple the electrically insulative cone to a hole defined in the wall of the chamber. The electrically insulative cone and flange are configured to pass the stem through the hole in the wall of the chamber while electrically insulating the stem from the wall of the chamber.

The electrically insulative cone, for example, comprises a cylindrical region extending a predetermined distance from the first end of the cone toward the second end of the electrically insulative cone to an inflection point. The cylindrical region, for example, has a fixed diameter, where an internal diameter of the electrically insulative cone tapers from the inflection point toward the second end of the electrically insulative cone.

According to another example, a first surface of the first end of the electrically insulative cone and a second surface of the second end of the electrically insulative cone are metallized. The RF feedthrough, for example, further comprises one or more metal shorting strips disposed between the first surface of the first end of the electrically insulative cone and the flange The one or more metal shorting strips may be further or alternatively disposed between the second surface of the electrically insulative cone and the stem.

In another example, the stem comprises a first stem end and a second stem end, wherein the first stem end comprises an accelerating electrode operably coupled thereto, and wherein a second end of the stem is configured to be coupled to a resonator coil.

In yet another example, one or more location features are provided and configured to operably couple the electrically insulative cone to the flange, whereby a position of the electrically insulative cone is selectively fixed with respect to the flange via the one or more location features.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1A:
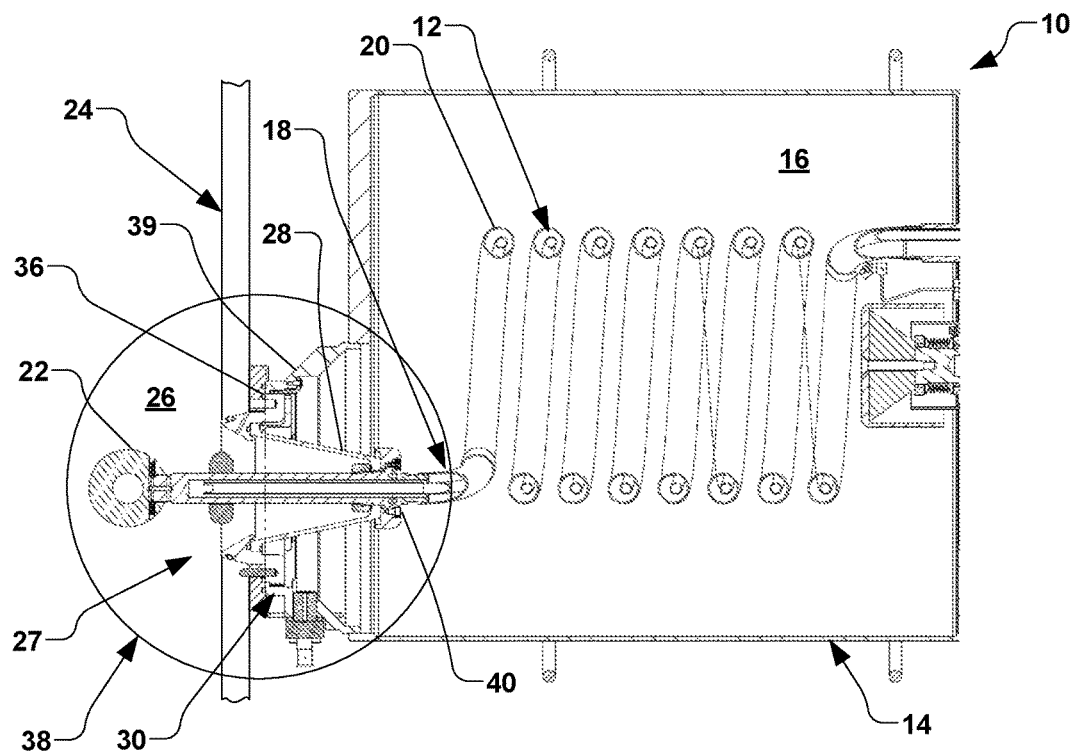
FIG. 1A illustrates a cross-sectional view of an example RF resonator.

The present disclosure is directed generally toward semiconductor processing systems, and more particularly, to an improved vacuum feedthrough for a radio frequency (RF) resonator that can be associated with an ion implantation system. Accordingly, the present disclosure will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present disclosure. It will be evident to one skilled in the art, however, that the present disclosure may be practiced without these specific details.

FIG. 1 illustrates a cross sectional view of an exemplary RF resonator system 10 (e.g., a 13.56 MHz resonator), whereby a resonance circuit 12 of the resonator system is housed in a housing 14 (e.g., a generally leak-tight aluminum cylindrical housing) which generally defines a resonator gas environment 16 (e.g., filled with a resonator gas such as sulfur hexafluoride ($SF_6$)). The resonator gas environment 16 generally prevents internal high voltage flashover, high voltage arcing, and plasma ignition. RF high voltage is developed on an open end side 18 of a resonance coil 20 (e.g., the left-most side of the resonance coil shown in FIG. 1), which drives an accelerating electrode 22 located in a vacuum chamber 24 having a high vacuum environment 26 associated therewith.

Since the resonator coil 20 is disposed in the resonator gas environment 16, and the electrode 22 is disposed in the high vacuum environment 26, the connection between the resonator coil and electrode passes through a generally vacuum-tight insulating feedthrough 27 having a ceramic cone 28 (e.g., called a "cone" due to its shape), which is also a mechanical support for the electrode. The design criteria for the ceramic cone 28 are generally quite stringent. For example, the ceramic cone 28 should hold greater than approximately 100 KV peak voltage to a surrounding metal housing 30 without causing high voltage sparking. Further, the ceramic cone 28 should prevent leakage of the resonator gas from the resonator gas environment 16 into the vacuum chamber 24, even at the highest operating voltage. The mechanical stability of the ceramic cone 28 should further hold the electrode 22 in a precise location, even at a high temperatures. Further, a low tangent delta of the insulating material that constitutes the ceramic cone 28 should reduce self-heating from internal RF losses.

High purity alumina ceramic, for example, is implemented for the composition of the ceramic cone 28 due to its mechanical strength and stability, low loss tangent for RF electrical field, good electrical breakdown strength, and good vacuum characteristics. However, some limitations are present with the ceramic cone 28 being comprised of such a ceramic. For example, cracking of the ceramic cone 28 from electrical sparking can occur, leading to a loss of resonator gas from the resonator gas environment 16 from the housing 14 and further leakage of resonator gas into the vacuum chamber 24. Further, as illustrated in FIG. 1B, a small amount of $SF_6$ gas, for example, may leak from the resonator gas environment 16 through a punch-through hole 32 (e.g., a hole that progresses through a wall 34 of the ceramic cone 28 by arcing or other forces), as well as through o-rings 36 associated with the ceramic cone.

Figure 1B:
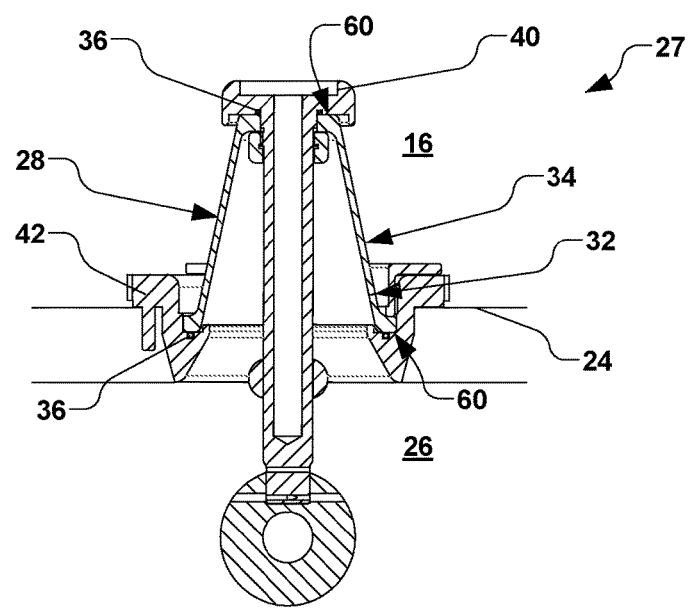
FIG. 1B illustrates a cross-sectional view of an example RF feedthrough.

A portion 38 of the RF resonator system 10 of FIG. 1A is further illustrated in FIG. 1B, whereby a resonator enclosure 39 (e.g., an aluminum enclosure) of FIG. 1A is not shown for clarity in FIG. 1B. The ceramic cone 28 shown in FIG. 1B, for example, may be implemented in an RF $SF_6$-to-vacuum feedthrough system of an RF linear accelerators or LINAC. A resonator stem 40 is connected to the open end side 18 of the resonance coil 20 in the resonator gas environment 16 of FIG. 1A, whereby the resonator stem also holds the accelerating electrode 22 in the vacuum environment 26. An aluminum flange 42 of FIG. 1B is further coupled to the vacuum chamber 24. The ceramic cone 28 thus separates the resonator gas environment 16 from high vacuum environment 26 via the o-rings 36 associated with the resonator stem 40 and the aluminum flange 42. A small aluminum ring (not shown) may also be present on the vacuum side of the resonator stem 40, of which primary purpose is to fine tune the resonance frequency of the resonance circuit by slightly changing the load capacitance.

Figure 2A:
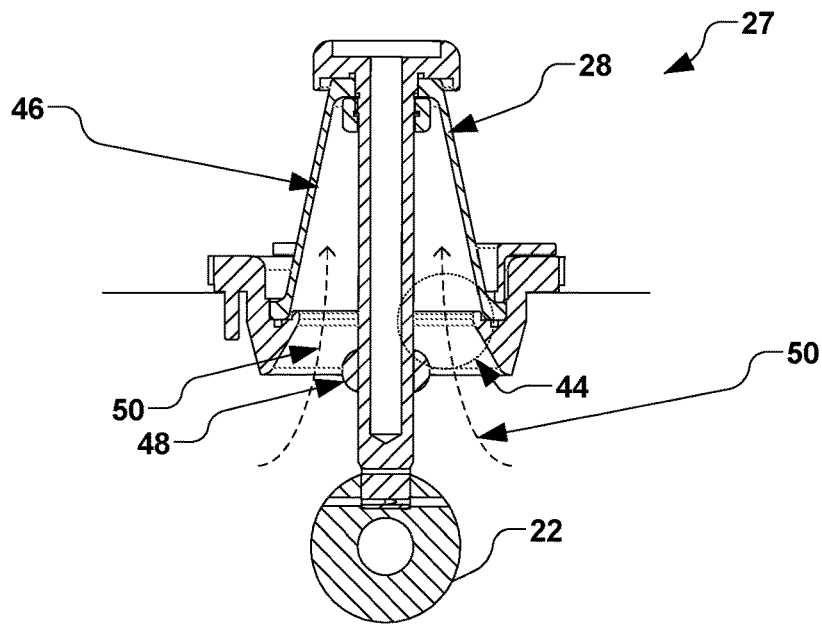
FIG. 2A is a cross-sectional view of an RF feedthrough showing a line-of-sight from an interior region of a vacuum chamber to an inner region of a conventional cone.
Figure 2B:
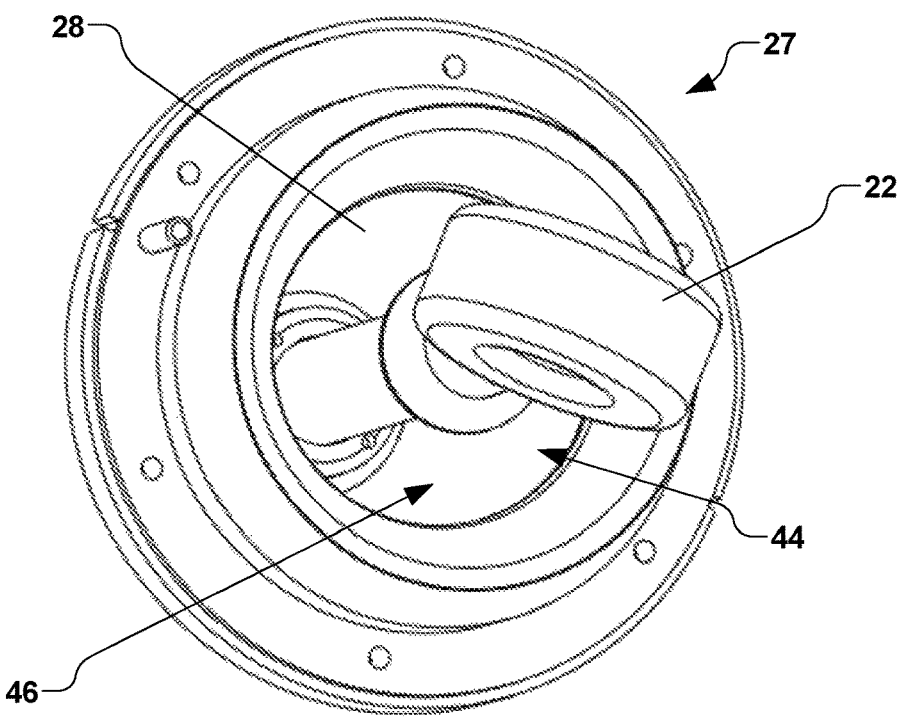
FIG. 2B is a perspective view of an RF feedthrough showing the line-of-sight of FIG. 2A.

In certain circumstances, the ceramic cone 28 shown in FIGS. 1A-1B may experience cracking (e.g., in region 44 shown in FIGS. 2A-2B). Upon close inspection of ceramic cones 28 that have experienced cracking, the present disclosure appreciates that an inside wall 46 (e.g., associated with the high vacuum environment 26) of the ceramic cones appears as being dark-colored. The disclosure presently appreciates that the pattern of the dark coloration of the ceramic cone 28 may arise from material being sputtered from the accelerating electrode 22. It is presently believed that the material sputtered from the accelerating electrode 22 enters into the inside wall 46 of the ceramic cone 28 through the opening around a padding cap 48 (e.g., illustrated as dashed lines 50 in FIG. 2A), thus leading to cracking, punch-through holes 32, and degradation of the o-rings 36 shown in FIG. 1B.

The present disclosure thus aims to mitigate various shortcomings of the feedthrough 27 of the RF resonator system 10 by providing an improved RF feedthrough having various features to increase a lifetime and stability of the RF resonator system and associated components. As such, the present disclosure generally ameliorates various deleterious issues associated with the feedthrough 27 of FIGS. 1A-1B and 2A-2B, such as cracking and punch-through holes associated with the ceramic cone 28, as well as degradation of o-rings 36 or other features associated therewith.

Figure 3A:
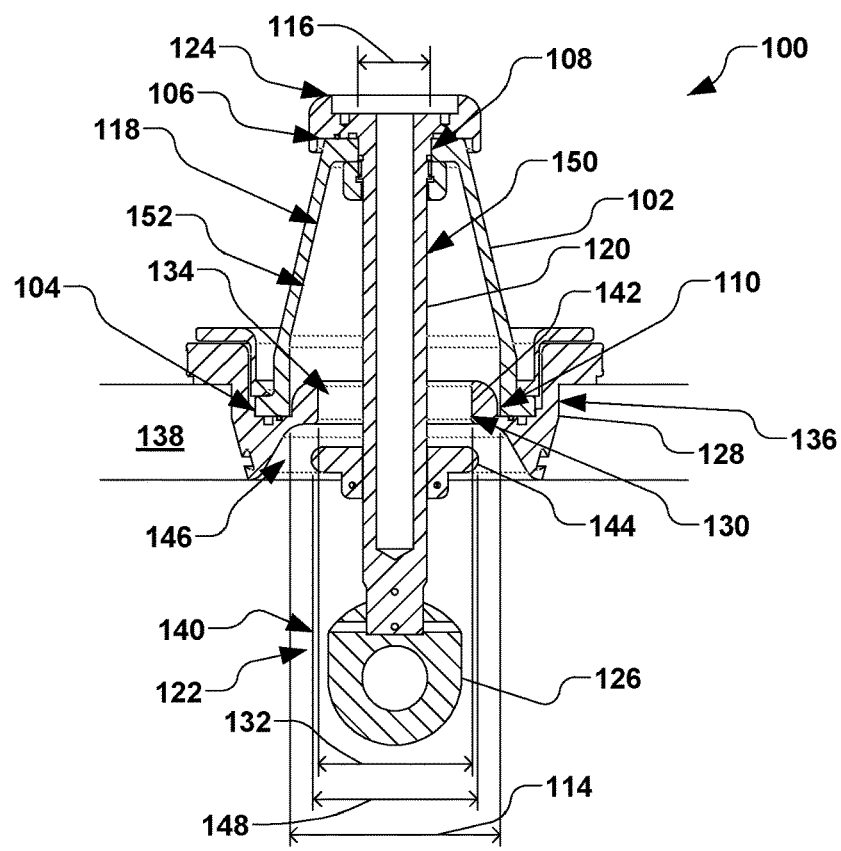
FIG. 3A is a cross-sectional view of an exemplary RF feedthrough in accordance with an aspect of the present disclosure, whereby a line-of-sight from an interior region of a vacuum chamber to an inner region of the cone is generally prevented.
Figure 3B:
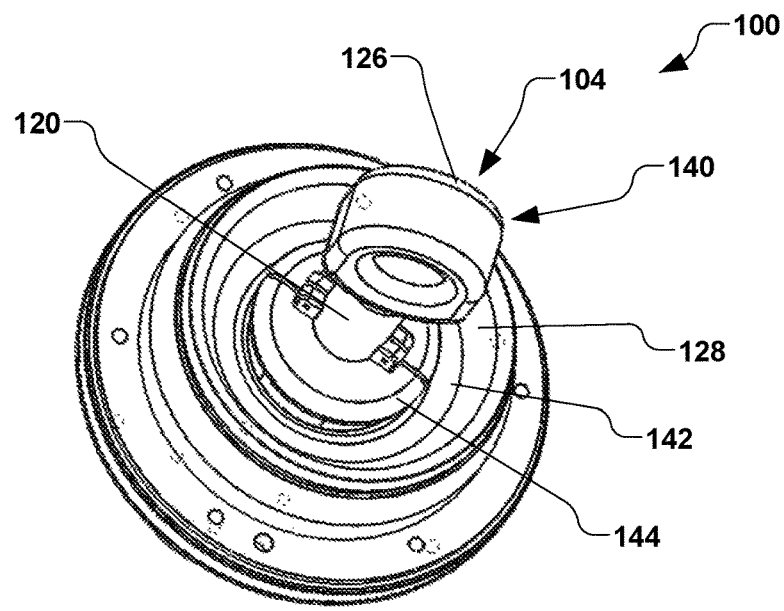
FIG. 3B is a perspective view of the RF feedthrough of FIG. 4A showing the prevention of the line-of-sight of FIG. 4A.

Therefore, in accordance with the present disclosure, an RF feedthrough 100, for example, is provided in FIGS. 3A-3B, whereby the RF feedthrough has various improvements that may be advantageously implemented in the RF resonator system 10 of FIG. 1A. The RF feedthrough 100 of FIGS. 3A-3B to be described hereafter provides various improvements to the feedthrough 27 of FIGS. 1A-1B and 2A-2B, such as generally preventing the aforementioned cracking and punch-through by providing a maze-like shielding to prevent line-of-sight access from the vacuum chamber to a region inside the feedthrough or cone. Further, the present disclosure provides protection of various features such as o-rings or other features associated with the RF feedthrough 100.

FIGS. 3A and 3B, for example, illustrate the exemplary RF feedthrough 100 in accordance with various aspects of the present disclosure. The RF feedthrough 100, for example, comprises an electrically insulative cone 102 (e.g., a ceramic cone) having a first cone end 104 and a second cone end 106. The electrically insulative cone 102 is generally hollow, having a first opening 108 at the first cone end 104 and a second opening 110 at the second cone end 106. The first opening 108, for example, has a first diameter 114 associated therewith, and the second opening 110 has a second diameter 116 associated therewith, and wherein the first diameter is larger than the second diameter, therein generally defining a tapered sidewall 118 of the electrically insulative cone.

A stem 120, is operably coupled to the electrically insulative cone 102 proximate to the second cone end 106, wherein the stem passes through the first opening 108 and second opening 110 of the electrically insulative cone. The stem 120, for example, comprises a first stem end 122 and a second stem end 124. In one example, an accelerating electrode 126 is operably coupled to stem 120 proximate to the first stem end 122. The accelerating electrode 126, for example, may be integral to, or fixedly coupled to, the first stem end 122 of the stem 120. Alternatively, the accelerating electrode 126 may be a selectively coupled to stem 120 proximate to the first stem end 122. The second stem end 124, for example, may be configured to be coupled to a resonator coil, such as the resonator coil 20 of FIG. 1A.

According to one example, a flange 128 is further illustrated in FIG. 3A, wherein the flange is operably coupled to the first cone end 104 of the electrically insulative cone 102. The flange 128, for example, may be comprised of a metal such as aluminum. The flange 128, for example, has a flange opening 130 defined therein, wherein the flange opening has a third diameter 132 associated therewith, and wherein the third diameter is smaller than the first diameter 114 of the electrically insulative cone 102. The stem 120, for example, is configured to pass through the flange opening 130 without contacting the flange 128, thereby defining a gap 134 between the stem and the flange. The flange 128, for example, is configured to operably couple the electrically insulative cone 102 to a hole 136 defined in a wall 138 of a chamber, such as the vacuum chamber 24 of FIG. 1A. Accordingly, the electrically insulative cone 102 and flange 128 of FIG. 3A, for example, are configured to pass the stem 120 through the hole 136 in the wall 138 of the chamber while electrically insulating the stem from the wall of the chamber.

The RF feedthrough 100, in accordance with one example of the present disclosure, advantageously generally prevents the accumulation of sputtered material from an electrode region 140 (e.g., proximate the first stem end 122) associated with the accelerating electrode 126 of the RF feedthrough via the provision of an internal rim 142 of the flange 128 shown in FIG. 3A in conjunction with a padding cap 144 that is operably coupled to the stem 120 in a region 146 proximate to the flange. In one example, the padding cap 144 has a fourth diameter 148 associated therewith, wherein the padding cap extends outwardly from an outer diameter 150 of the stem 120. Accordingly, the padding cap 144, in conjunction with the flange 128 and stem 120, generally prevent a line-of-sight from one or more regions, such as the electrode region 140, within the vacuum chamber 24 of FIG. 1A to an inner surface 152 of the electrically insulative cone 102 of FIG. 3A. FIG. 3B, for example, illustrates the lack of line-of-sight from the electrode region 140 to the inner surface 152 of the electrically insulative cone 102 of FIG. 3A provided by the RF feedthrough 100 of the present disclosure (e.g., the inner surface 152 of the electrically insulative cone 102 of FIG. 3A is not visible from the electrode region 140 shown in FIG. 3B, contrary to the inside wall 46 of the ceramic cone 28 of FIG. 2B being visible from a similar region).

Figure 4:
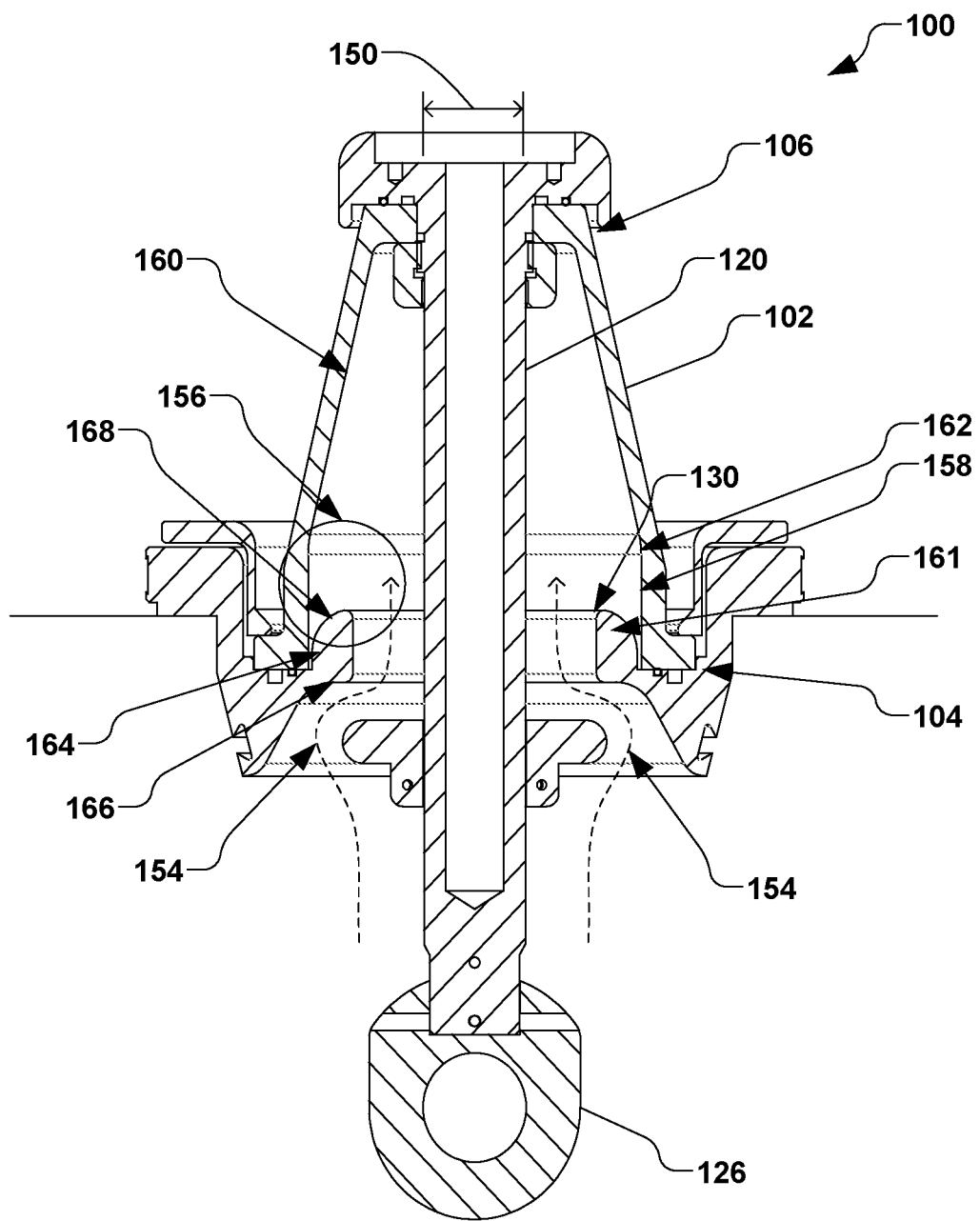
FIG. 4 is a cross-sectional view of another exemplary RF feedthrough in accordance with various aspects of the present disclosure.

By blocking line-of-sight from the possible source of sputtering associated with an accelerating electrode 126 as shown in FIGS. 3A and 3B, the third diameter 132 of the flange opening 130 and the fourth diameter 148 of the padding cap 144 generally define an effective maze-like shield, as shown as dashed lines 154 in FIG. 4. The present disclosure appreciates that sputtered material, such as material (not shown) emanating from the accelerating electrode 126, would find difficulty navigating the maze-like shield 154 provided by the flange opening 130 and the padding cap 144 being sized so as to prevent the aforementioned line-of-sight from the electrode region 140 to the inner surface 152 of the electrically insulative cone 102.

The present disclosure contemplates the electrically insulative cone 102 being comprised of a ceramic, such as alumina, or other suitable ceramic material. The present disclosure further contemplates that thermal expansion associated with the electrically insulative cone 102 could be responsible for cracking of the electrically insulative cone due to a confined local heating associated with a high voltage spark. Accordingly, in another example of the present disclosure, the electrically insulative cone 102 may be comprised of quartz, or comprise a combination of quartz and alumina or other ceramic material(s). The significantly small thermal expansion coefficient of quartz, as compared to that of alumina, for example, thus further limits the potential of cracking of the electrically insulative cone 102 due to concentrated local heating.

In accordance with yet another aspect, the present disclosure mitigates the formation of the aforementioned punch-through holes in the electrically insulative cone 102 (e.g., in a bottom region 156 of FIG. 4). In extreme high RF voltage operation, it is found that miniscule punch-through holes 32 may be developed on the sloped walls of the ceramic cone 28 in the region 44 of FIGS. 2A-2B, near the base or wide end of the ceramic cone. The present disclosure appreciates that a generally perpendicular contact region 158 shown between the electrically insulative cone 102 and the flange 128 is more stable in high voltage holding than the sloping contact in the ceramic cone 28 shown in FIG. 1B. However, it is also appreciated that the outer diameter 150 of the stem 120 of FIG. 4 may be limited or restricted by an amount of capacitance increase associated therewith, whereby the resonance frequency may be limited to a narrow range of tunability.

In order to ameliorate the above problems, according to another example, the present disclosure provides the electrically insulative cone 102 shown in FIG. 4 with the generally straight, cylinder-like contact region 158 associated with the first cone end 104 and a sloping wall region 160 extending toward the second cone end 106 from an inflection point 162. In addition to such an advantageous shape of the electrically insulative cone 102, an inner shield wall 161 is provided on the flange 128, whereby the inner shield wall is increased or raised in order to lower the electric field in the bottom region 156 of the electrically insulative cone 102. Further, the flange 128 comprises a lip 164 extending from a lower region 166 associated with the contact region 158 (e.g., associated with the first cone end 104 of the electrically insulative cone 102) toward the second cone end 106 of the electrically insulative cone, wherein the lip has curved region 168 configured to ameliorate arcing between the flange and the electrically insulative cone.

It is further appreciated that electrical discharge (e.g., sparks) across interface surfaces between the flange 128 (which is generally electrically conductive) and electrically insulative cone 102 may be deleterious. For example, in FIG. 1B, two such interface surfaces 60 are shown where the resonator stem 40 meets the top of the ceramic cone 28 and where the bottom ceramic cone meets the aluminum flange 42. Electrical discharges across these interface surfaces 60 increase the risk of damaging the vacuum-sealing o-rings 36, which could lead to possible leakage of the resonator gas environment 16 (e.g. a leakage of $SF_6$) into the high vacuum environment 26 of FIG. 1A.

Figure 5:
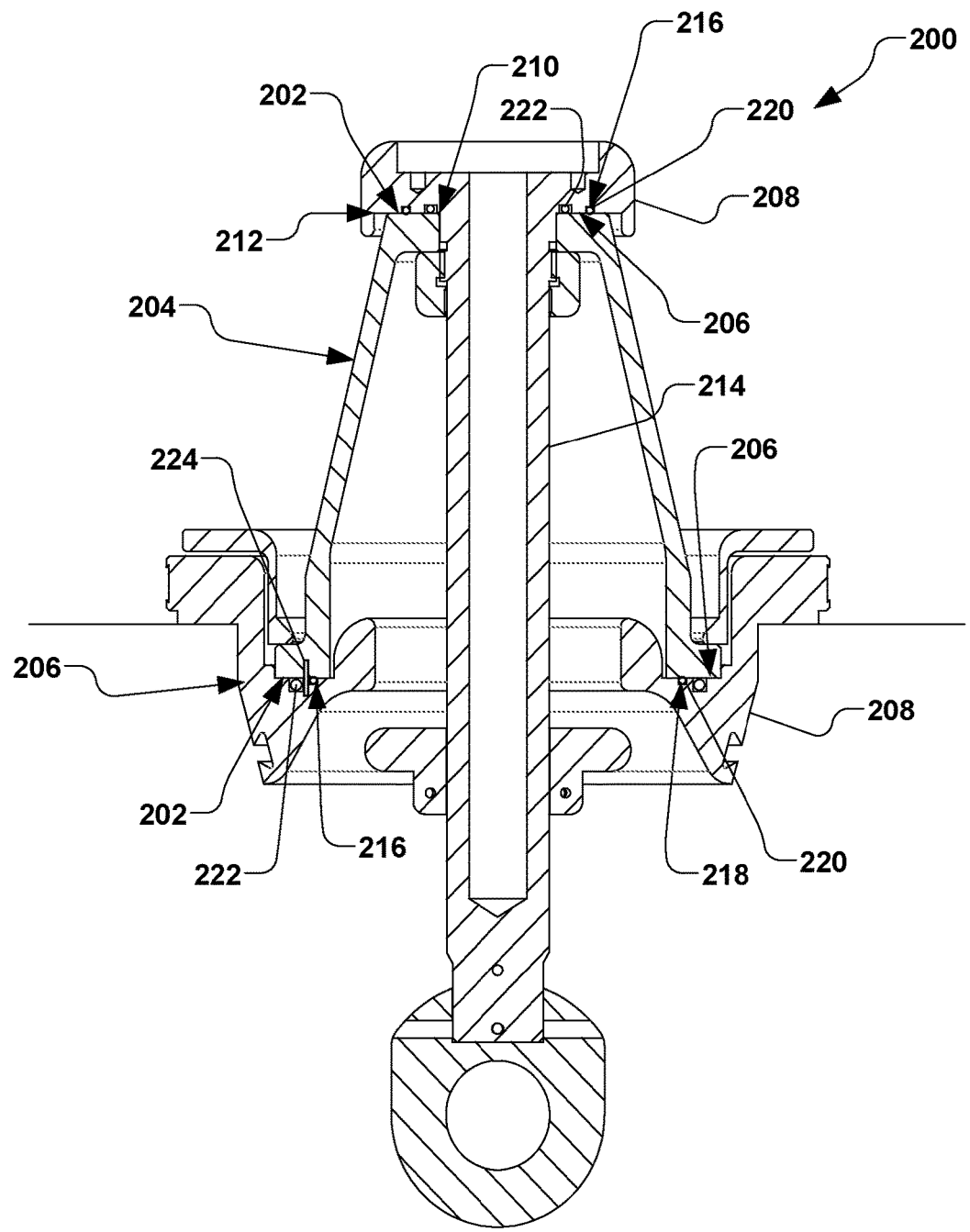
FIG. 5 is a cross-sectional view of still another exemplary RF feedthrough in accordance with various aspects of the present disclosure.

Thus, in accordance with another aspect of the present disclosure, another exemplary RF feedthrough 200 is illustrated in FIG. 5, whereby two improvements are provided to prevent the electrical discharge. In one example, one or more surfaces 202 of an electrically insulative cone 204 are metallized, whereby the one or more surfaces face and/or contact respective conductive surfaces 206 of one or more electrically conductive components 208 (e.g., metallic components), such as a flange 210 or portion 212 of a stem 214. For example, the one or more surfaces 202 of the electrically insulative cone 204 may comprise any of the surfaces of the electrically insulative cones 102 of FIGS. 3A, 3B, and 4 that contact an electrically conductive surface of the respective stem 120 and flange 128. Accordingly, as illustrated in FIG. 5, the one or more surfaces 202 are respectively electrically coupled or connected to the one or more electrically conductive components 208, thus mitigating sparks or other deleterious electrical discharge therebetween. The present disclosure contemplates, for example, a metallization of the one or more surfaces 202, and in one example, an electrically conductive shorting strip 216, such as a strip of metal spring 218 positioned in one or more grooves 220, electrically connects the one or more surfaces to the respective electrically conductive components 208. Such mitigation of electrical discharge further advantageously protects vacuum-sealing o-rings 222 from damage.

Further, in another example, one or more location features 224 may be provided to further operably couple the electrically insulative cone 204 to the flange 210 such that a position of the electrically insulative cone with respect to the flange is accurately maintained. The one or more location features 224, for example, may comprise one or more pins generally fixedly coupled to the flange 210 and configured to interface with one or more of a notch, hole, or other placement feature (not shown) associated with the electrically insulative cone 204, such that the position of the electrically insulative cone with respect to the flange is substantially fixed. Alternatively, the one or more location features 224 may comprise a flat (not shown) or other feature that may be provided on the electrically insulative cone 204 to selectively interface with a mating flat (not shown) or other feature on the flange 210, such that at least a rotational position of the electrically insulative cone with respect to the flange is selectively maintained.

Accordingly, the present disclosure provides for protecting the inner surface of an electrically insulative cone for an RF feedthrough by generally defining a maze configured to substantially eliminate the line of sight from the source of sputtering to the inner surface of the electrically insulative cone. Further, the present disclosure utilizes, in one example, an insulator material such as quartz for the electrically insulative cone due to its substantially small coefficient of thermal expansion to ameliorate cracking from localized heating from electrical discharge. The shape of the electrically insulative cone, for example, is provided having a cylindrical shape proximate to a bottom region and a sloped or conical shape proximate to a top region thereof, in order to provide a perpendicular interface to the bottom metal surface. Further, a raised metal shield is provided to generally protect the electrically insulative cone near the bottom region, thereof. In another example, the interface surface of the electrically insulative cone is metalized for electrical conduction. Additionally, a metal shorting strip, such as a metal spring strip, may be provided between the ceramic/metal interface, whereby the metal strip safely conducts away an accumulated charge on the ceramic to avoid electrical discharge between the interface surfaces.

In accordance with various examples, an RF feedthrough for an ion implantation system is provided. The RF feedthrough may comprise a cone that is electrically insulative and has a first end and a second end. The cone, for example, is generally hollow and has a first opening at the first end and a second opening at the second end, wherein the first opening has a larger diameter than the second opening, therein defining a tapered sidewall of the cone. A stem, for example, passes through the first and second openings of the cone.

In one example, a flange is operably coupled to the first end of the cone, wherein the flange is configured to operably couple the cone to a wall of a chamber (e.g., associated with an ion source) and to pass the stem through an opening of the flange and a hole in the wall of the chamber. A padding cap, for example, is operably coupled to the stem in a region proximate to the flange, and extends outwardly a predetermined distance from an outer diameter of the stem, therein generally preventing a line-of-sight from a region within the chamber to an inner surface of the cone.

One or more o-rings may be provided to generally seal an interface between the flange and the cone, and another one or more o-rings may seal an interface between the stem and the cone. A first surface of the first end of the cone and a second surface of the second end of the cone may be metallized. One or more metal shorting strips may be disposed between the first surface of the first end of the cone and the flange, and another one or more metal shorting strips are disposed between the second surface of the cone and the stem.

A body of the cone may be comprised of a ceramic comprising one of alumina and quartz. The cone may have a cylindrical region having a fixed diameter extending a predetermined distance from the first end of the cone toward the second end of the cone to an inflection point. The flange may comprise a lip extending from a region associated with the first end of the cone toward the second end of the cone, wherein the lip has a curved region configured to ameliorate arcing between the flange and the cone. The cone may comprise an interface surface between the first end of the cone and the flange, wherein the interface surface is generally perpendicular to an inner surface of the cone in the cylindrical region. The interface surface may be metallized.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. An RF feedthrough for an ion implantation system, the RF feedthrough comprising:
   an electrically insulative cone having a first cone end and a second cone end, wherein the electrically insulative cone is generally hollow and has a first opening at the first cone end and a second opening at the second cone end, wherein the first opening has a first diameter associated therewith and the second opening has a second diameter associated therewith, and wherein the first diameter is larger than the second diameter, therein generally defining a tapered sidewall of the electrically insulative cone;
   a stem operably coupled to the second cone end of the electrically insulative cone, wherein the stem passes through the first opening and second opening of the electrically insulative cone; and
   a flange operably coupled to the first cone end of the electrically insulative cone, wherein the flange has a flange opening defined therein, wherein the flange opening has a third diameter associated therewith, wherein the third diameter is smaller than the first diameter, and wherein the stem passes through the flange opening without contacting the flange, and wherein the flange is configured to operably couple the electrically insulative cone to a hole defined in a wall of a chamber, wherein the electrically insulative cone and flange are configured to pass the stem through the hole in the wall of the chamber while electrically insulating the stem from the wall of the chamber.

2. The RF feedthrough of claim 1, further comprising a padding cap operably coupled to the stem in a region proximate to the flange, wherein the padding cap extends outwardly a predetermined distance from an outer diameter of the stem, therein generally preventing a line-of-sight from a region within the chamber to an inner surface of the cone.

3. The RF feedthrough of claim 2, wherein the padding cap has a fourth diameter associated therewith, wherein the fourth diameter is greater than the third diameter.

4. The RF feedthrough of claim 1, wherein the flange is comprised of aluminum.

5. The RF feedthrough of claim 1, wherein the stem comprises a first stem end and a second stem end, wherein the first stem end comprises an accelerating electrode operably coupled thereto, and wherein the second stem end is configured to be coupled to a resonator coil.

6. The RF feedthrough of claim 5, wherein respective interfaces between the electrically insulative cone, stem, flange, and wall of the chamber seal a chamber environment within the chamber from an environment associated with the resonator coil.

7. The RF feedthrough of claim 6, wherein one or more o-rings generally seal an interface between the flange and the electrically insulative cone, and another one or more o-rings seal an interface between the stem and the electrically insulative cone.

8. The RF feedthrough of claim 1, wherein a first surface of the first end of the electrically insulative cone and a second surface of the second end of the electrically insulative cone are metallized.

9. The RF feedthrough of claim 8, further comprising one or more metal shorting strips disposed between the first surface of the first end of the electrically insulative cone and the flange, and one or more metal shorting strips are disposed between the second surface of the electrically insulative cone and the stem.

10. The RF feedthrough of claim 9, wherein the one or more metal shorting strips comprise one or more metal springs.

11. The RF feedthrough of claim 1, wherein a body of the electrically insulative cone is comprised of a ceramic.

12. The RF feedthrough of claim 1, wherein a body of the electrically insulative cone comprises one or more of alumina and quartz.

13. The RF feedthrough of claim 1, further comprising one or more location features configured to operably couple the electrically insulative cone to the flange, whereby a position of the electrically insulative cone is selectively fixed with respect to the flange via the one or more location features.

14. The RF feedthrough of claim 1, wherein the electrically insulative cone comprises a cylindrical region extending a predetermined distance from the first end of the cone toward the second end of the electrically insulative cone to an inflection point, wherein the cylindrical region has a fixed diameter, and where an internal diameter of the electrically insulative cone tapers from the inflection point toward the second end of the electrically insulative cone.

15. The RF feedthrough of claim 14, wherein the electrically insulative cone comprises an interface surface between the first end of the electrically insulative cone and the flange, wherein the interface surface is generally perpendicular to an inner surface of the electrically insulative cone in the cylindrical region.

16. The RF feedthrough of claim 14, wherein the flange comprises a lip extending from a region associated with the first end of the electrically insulative cone toward the second end of the electrically insulative cone, wherein the lip has curved region configured to ameliorate arcing between the flange and the electrically insulative cone.

17. An RF resonator for an ion implantation system, the RF resonator comprising:
   a resonator chamber defining a chamber environment, wherein the chamber environment is generally isolated from a vacuum environment by a wall of the chamber;
   a resonator coil disposed within the resonator chamber; and
   an RF feedthrough, comprising:
      an electrically insulative cone having a first cone end and a second cone end, wherein the electrically insulative cone is generally hollow and has a first opening at the first cone end and a second opening at the second cone end, wherein the first opening has a first diameter associated therewith and the second opening has a second diameter associated therewith, and wherein the first diameter is larger than the second diameter, therein generally defining a tapered sidewall of the electrically insulative cone;
      a stem operably coupled to the second cone end of the electrically insulative cone, wherein the stem passes through the first opening and second opening of the electrically insulative cone;
      a flange operably coupled to the first cone end of the electrically insulative cone, wherein the flange has a flange opening defined therein, wherein the flange opening has a third diameter associated therewith, wherein the third diameter is smaller than the first diameter, and wherein the stem passes through the flange opening without contacting the flange, and wherein the flange is configured to operably couple the electrically insulative cone to a hole defined in the wall of the chamber, wherein the electrically insulative cone and flange are configured to pass the stem through the hole in the wall of the chamber while electrically insulating the stem from the wall of the chamber; and a padding cap operably coupled to the stem in a region proximate to the flange, wherein the padding cap extends outwardly a predetermined distance from an outer diameter of the stem to a fourth diameter, wherein the fourth diameter is greater than the third diameter, and wherein a line-of-sight is generally prevented from a region within the chamber to an inner surface of the cone by the flange, padding cap, and stem.

18. The RF resonator of claim 17, wherein the electrically insulative cone comprises a cylindrical region extending a predetermined distance from the first end of the cone toward the second end of the electrically insulative cone to an inflection point, wherein the cylindrical region has a fixed diameter, and where an internal diameter of the electrically insulative cone tapers from the inflection point toward the second end of the electrically insulative cone.

19. The RF resonator of claim 17, wherein a first surface of the first end of the electrically insulative cone and a second surface of the second end of the electrically insulative cone are metallized, and wherein the RF feedthrough further comprises one or more metal shorting strips disposed between the first surface of the first end of the electrically insulative cone and the flange, and one or more metal shorting strips are disposed between the second surface of the electrically insulative cone and the stem.

20. The RF resonator of claim 17, wherein the stem comprises a first stem end and a second stem end, wherein the first stem end comprises an accelerating electrode operably coupled thereto, and wherein the second stem end is configured to be coupled to a resonator coil.

* * * * *